(12) United States Patent
Sinclair (10) Patent No.: US 11,476,087 B2
(45) Date of Patent: Oct. 18, 2022

(54) ION IMPLANTATION SYSTEM AND LINEAR ACCELERATOR HAVING NOVEL ACCELERATOR STAGE CONFIGURATION

(71) Applicant: Applied Materials, Inc., Santa Clara, CA (US)

(72) Inventor: Frank Sinclair, Boston, MA (US)

(73) Assignee: Applied Materials, Inc., Santa Clara, CA (US)

(*) Notice: Subject to any disclaimer, the term of this patent is extended or adjusted under 35 U.S.C. 154(b) by 157 days.

(21) Appl. No.: 16/984,053

(22) Filed: Aug. 3, 2020

(65) Prior Publication Data

US 2022/0037116 A1 Feb. 3, 2022

(51) Int. Cl.
*H01J 37/317* (2006.01)
*H01J 37/32* (2006.01)

(52) U.S. Cl.
CPC .... *H01J 37/3171* (2013.01); *H01J 37/32082* (2013.01); *H01J 37/32247* (2013.01)

(58) Field of Classification Search
None
See application file for complete search history.

(56) References Cited

U.S. PATENT DOCUMENTS

| | | | | |
|---|---|---|---|---|
| 4,667,111 A | * | 5/1987 | Glavish | H01J 37/3171 315/505 |
| 5,296,714 A | * | 3/1994 | Treglio | H01J 27/08 315/111.41 |
| 5,796,219 A | * | 8/1998 | Hirakimoto | H05H 7/12 315/506 |
| 5,801,488 A | * | 9/1998 | Fujisawa | H05H 9/00 315/505 |
| 5,907,158 A | * | 5/1999 | Nasser-Ghodsi | H01J 37/3171 250/492.21 |
| 6,242,747 B1 | * | 6/2001 | Sugitani | H05H 9/00 250/251 |

(Continued)

FOREIGN PATENT DOCUMENTS

| | | | | |
|---|---|---|---|---|
| DE | 3616569 A | * | 11/1986 | H01J 37/3171 |
| GB | 2209242 A | * | 5/1989 | H05H 9/00 |

(Continued)

OTHER PUBLICATIONS

International Search Report and Written Opinion dated Oct. 29, 2021, for the International Patent Application No. PCT/US2021/040495, filed on Jul. 6, 2021, 10 pages.

*Primary Examiner* — Srinivas Sathiraju
(74) *Attorney, Agent, or Firm* — KDB Firm PLLC (57) ABSTRACT

An ion implantation system, including an ion source and extraction system, arranged to generate an ion beam at a first energy, and a linear accelerator, disposed downstream of the ion source, the linear accelerator arranged to receive the ion beam as a bunched ion beam accelerate the ion beam to a second energy, greater than the first energy. The linear accelerator may include a plurality of acceleration stages, wherein a given acceleration stage of the plurality of acceleration stages comprises: a drift tube assembly, arranged to conduct the ion beam; a resonator, electrically coupled to the drift tube assembly; and an RF power assembly, coupled to the resonator, and arranged to output an RF signal to the resonator. As such, the given acceleration stage does not include a quadrupole element.

11 Claims, 5 Drawing Sheets

(56) References Cited

U.S. PATENT DOCUMENTS

| | | | | |
|---|---|---|---|---|
| 6,262,638 B1* | 7/2001 | Scherer | H05H 7/02 | 315/505 |
| 6,291,828 B1* | 9/2001 | Saadatmand | H01J 37/3171 | 250/492.21 |
| 6,320,334 B1* | 11/2001 | Roberge | H01J 37/304 | 315/505 |
| 6,326,746 B1* | 12/2001 | Chen | H05H 9/00 | 315/505 |
| 6,423,976 B1* | 7/2002 | Glavish | H01J 37/3171 | 315/505 |
| 6,777,893 B1* | 8/2004 | Swenson | H05H 9/00 | 315/505 |
| 6,949,895 B2* | 9/2005 | DiVergilio | H01J 37/12 | 315/505 |
| 7,098,615 B2* | 8/2006 | Swenson | H05H 9/00 | 315/505 |
| 7,767,561 B2* | 8/2010 | Hanawa | H01J 37/32357 | 257/E21.057 |
| 8,324,810 B2* | 12/2012 | Kazakov | H05H 7/06 | 315/505 |
| 9,269,541 B2* | 2/2016 | Inada | H01J 37/3171 | |
| 10,505,334 B2* | 12/2019 | Yang | H01J 23/06 | |
| 10,651,011 B2* | 5/2020 | Sinclair | H01J 37/20 | |
| 10,943,767 B1* | 3/2021 | Kowal | H03L 7/0814 | |
| 10,991,546 B1* | 4/2021 | Kowal | H01J 37/3171 | |
| 11,089,670 B2* | 8/2021 | Mishin | H05H 7/02 | |
| 11,160,158 B1* | 10/2021 | Nguyen | H05H 9/048 | |
| 11,189,460 B1* | 11/2021 | Carlson | H01J 37/3171 | |
| 11,217,427 B1* | 1/2022 | Renau | H01J 37/304 | |
| 2002/0084427 A1* | 7/2002 | Saadatmand | H05H 9/00 | 250/492.1 |
| 2003/0038254 A1* | 2/2003 | Saadatmand | H01J 37/3171 | 315/505 |
| 2009/0314949 A1* | 12/2009 | Plettner | H05H 7/06 | 250/397 |
| 2010/0072401 A1* | 3/2010 | Parrill | H01L 21/26506 | 250/492.21 |
| 2010/0072405 A1* | 3/2010 | Yu | H01J 25/02 | 250/493.1 |
| 2012/0175518 A1* | 7/2012 | Godet | H01J 37/244 | 250/492.21 |
| 2014/0345522 A1* | 11/2014 | Kabasawa | H01L 21/26506 | 118/688 |
| 2016/0174355 A1* | 6/2016 | Lal | H01J 37/06 | 315/505 |
| 2016/0293154 A1* | 10/2016 | Yang | G10K 11/172 | |
| 2018/0120504 A1* | 5/2018 | Qi | G02B 6/3636 | |
| 2018/0197716 A1* | 7/2018 | Sasaki | H01J 37/304 | |
| 2018/0276164 A1* | 9/2018 | Das Sharma | G06F 13/405 | |
| 2019/0371562 A1* | 12/2019 | Sinclair | H05H 9/00 | |
| 2020/0066486 A1* | 2/2020 | Sinclair | H01J 37/3171 | |
| 2020/0234918 A1* | 7/2020 | Sinclair | H01J 37/3007 | |
| 2020/0357603 A1* | 11/2020 | Sinclair | H01J 37/3171 | |
| 2021/0074508 A1* | 3/2021 | Lee | H01J 37/244 | |
| 2021/0307152 A1* | 9/2021 | Kowal | H01J 37/08 | |
| 2022/0037116 A1* | 2/2022 | Sinclair | H01J 37/32082 | |

FOREIGN PATENT DOCUMENTS

| | | | |
|---|---|---|---|
| JP | 6041975 B2 | 12/2016 | |
| KR | 10-2014-0018392 A | 2/2014 | |

* cited by examiner

ION IMPLANTATION SYSTEM AND LINEAR ACCELERATOR HAVING NOVEL ACCELERATOR STAGE CONFIGURATION

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage.

Implantation apparatus capable of generating ion energies of approximately 1 MeV or greater are often referred to as high energy ion implanters, or high energy ion implantation systems. One type of high energy ion implanter employs what is termed linear accelerator, or LINAC, where a series of electrodes conduct and accelerate the ion beam to increasingly higher energy along a succession of "acceleration stages", RF-LINACS (unless otherwise noted, the term LINAC as used herein will refer to an RF-LINAC) use electrodes that receive an AC voltage signal at radio frequency in the range of tens of MegaHertz that accelerates an ion beam as the ion beam is conducted through the given acceleration stage. Known (RF) LINACs are driven by an RF voltage applied at 13.56 MHz-120 MHz, applied to the various acceleration stages of the LINAC, where the number of acceleration stages may range up to more than one dozen.

Known ion implantation systems employ RF-LINACs where each acceleration stage includes a resonator that is coupled to the acceleration electrodes to drive an RF signal at a given voltage amplitude in order to achieve a targeted acceleration in energy of the ion beam. In this manner, the ion energy of an ion beam traversing the LINAC is increased at each acceleration stage in steps until a final target energy is reached. A given acceleration stage includes acceleration electrodes as well as grounded electrodes arranged as hollow, electrically conductive "drift tubes," separated by gaps between the drift tubes, where acceleration of the ion beam takes place over the gaps.

In order to avoid unwanted beam spread, known high energy ion implanters that use RF-LINACs employ DC quadrupole components as an integral part of each acceleration stage of a LINAC. These quadrupole components may be arranged as electrostatic quadrupoles or magnetic quadrupoles.

These quadrupole components used in LINACs for high energy implantation systems harness the design of accelerators used for high energy physics research. The use of quadrupoles addresses the problem that was in part captured by Earrnshaw's theorem, which theorem states that a collection of point charges cannot be maintained in a stable stationary equilibrium configuration solely by the electrostatic interaction of the charges. The quadrupoles advantageously counteract the tendency of the RF electrodes of the acceleration stage to produce radial defocusing as a consequence of phase focusing of the ion beam as conducted through the acceleration stage.

In known designs, the quadrupole components may be conveniently arranged around the grounded drift tubes of a given acceleration stage. In some designs, two separate quadrupoles may be arranged along opposite ends of an acceleration stage, while in other designs, one quadrupole may be used per stage. However, the design of acceleration stages in RF-LINACS of known ion implantation systems is rather complex.

In view of the above, further improvements to the current architecture of RF-LINACs in ion implantation systems is useful.

With respect to these and other considerations the present disclosure is provided.

BRIEF SUMMARY

Various embodiments are related to novel ion implantation apparatus.

In one embodiment, an ion implantation system may include an ion source and extraction system, arranged to generate an ion beam at a first energy; and a linear accelerator, disposed downstream of the ion source, the linear accelerator arranged to receive the ion beam as a bunched ion beam accelerate the ion beam to a second energy, greater than the first energy, wherein the linear accelerator comprises a plurality of acceleration stages. As such, a given acceleration stage of the plurality of acceleration stages may include a drift tube assembly, arranged to conduct the ion beam; a resonator, electrically coupled to the drift tube assembly; and an RF power assembly, coupled to the resonator, and arranged to output an RF signal to the resonator, wherein the given acceleration stage does not include a quadrupole element.

In another embodiment, a method of operating an ion implanter may include generating an ion beam, bunching the ion beam, wherein the ion beam is transformed into a plurality of bunched ion packets, and accelerating the bunched ion packets through a plurality of acceleration stages of a linear accelerator to a high ion energy. As such, the accelerating may include: in at least one stage of the plurality of acceleration stages, applying an RF signal to a drift tube assembly to accelerate the ion beam from an initial ion energy to a higher ion energy, without applying a quadrupole field to the ion beam, wherein the ion beam is focused by the drift tube assembly; and implanting the ion beam at the ion energy into a substrate.

In a further embodiment, a linear accelerator is provided, disposed within an ion implantation system. The linear accelerator may include a plurality of acceleration stages, wherein at least one acceleration stage of the plurality of acceleration stages comprises a drift tube assembly, arranged to conduct the ion beam as a bunched ion beam. The drift tube assembly may include a triple gap configuration or a double gap configuration. The at least one acceleration stage may further include a resonator, electrically coupled to the drift tube assembly. As such, at least one acceleration stage of the linear accelerator does not include a quadrupole element.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that provide the capability of flexibly adjusting the effective drift length within acceleration stages of a linear accelerator.

Figure 1A:
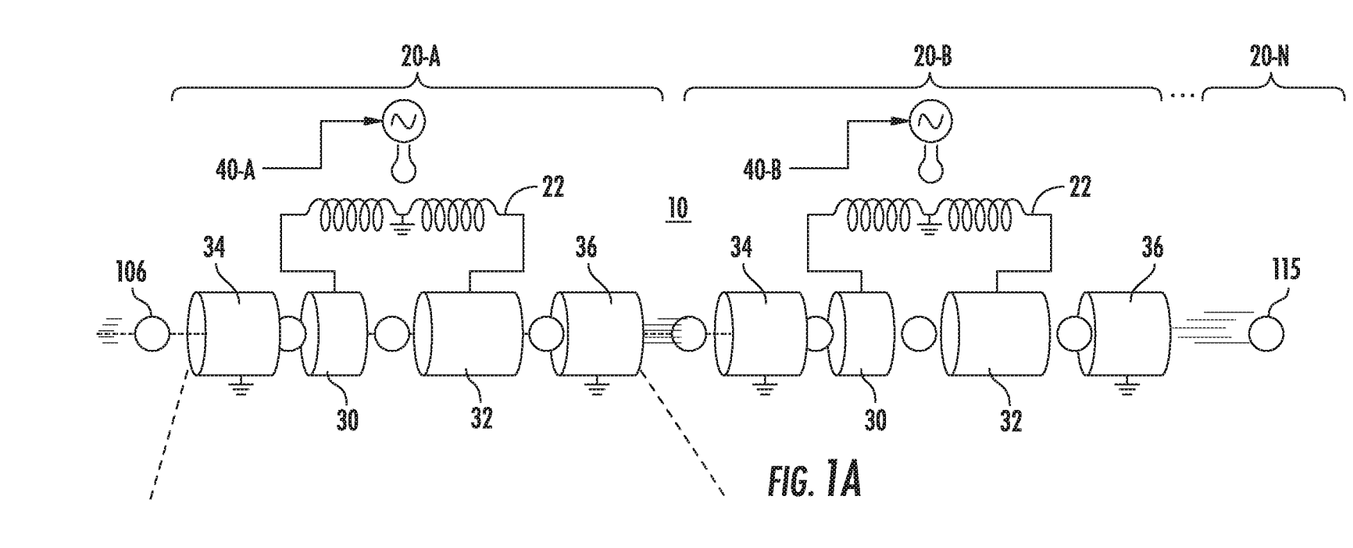
FIG. 1A shows an exemplary apparatus, according to embodiments of the disclosure.

FIG. 1A depicts a schematic of a linear accelerator, according to embodiments of the disclosure. The linear accelerator 10 includes an acceleration stage 20-A, as well as associated electrical circuitry, including an RF power assembly 40-A, as well as a resonator 22. As shown in FIG. 1A, the linear accelerator 10 may include a plurality of acceleration stages, shown as acceleration stages 20-B . . . 20-N. In various embodiments, the one or more of the stages of the linear accelerator 10 may include the components of the acceleration stage 20-A as detailed herein.

Figure 1B:
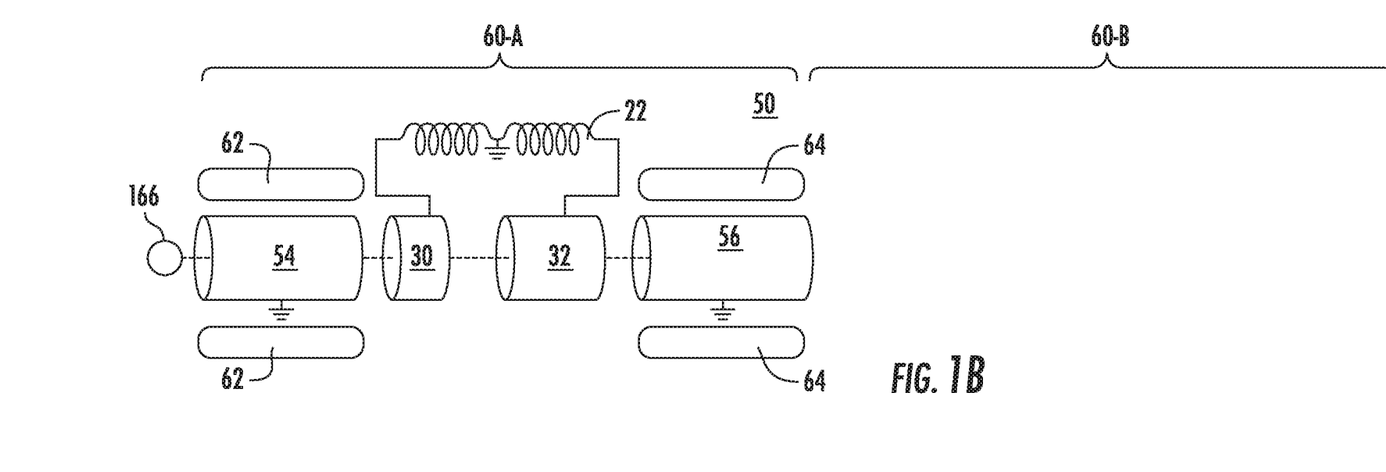
FIG. 1B shows a reference apparatus.
Figure 1C:
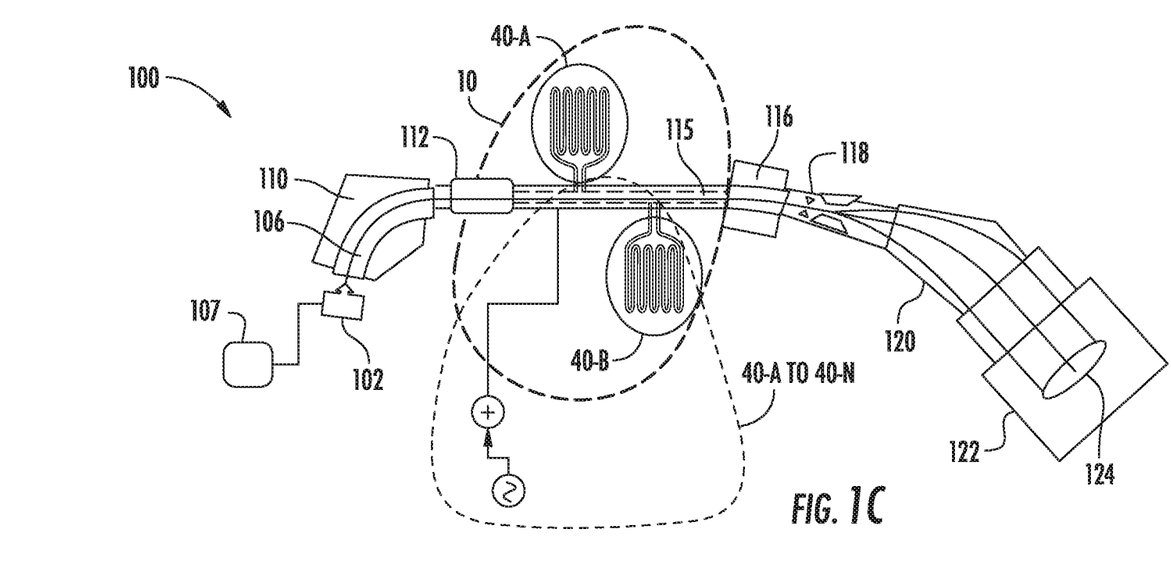
FIG. 1C shows an exemplary ion implantation system, according to embodiments of the disclosure.

To place the operation of linear accelerator 10 in context, FIG. 1C illustrates an ion implanter 100, which implanter may represent a beamline ion implanter, with some elements not shown for clarity of explanation. The ion implanter 100 may include an ion source 102, and a gas box 107 disposed in a terminal 104 as known in the art. The ion source 102 may include an extraction system including extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implanter 100 includes various additional components for accelerating the ion beam 106.

The ion implanter 100 may include an analyzer 110, functioning to analyze the ion beam 106 as in known apparatus, by changing the trajectory of the ion beam 106, as shown. The ion implanter 100 may also include a buncher 112, and a linear accelerator 10 (shown in the dashed line), disposed downstream of the buncher 112, where the linear accelerator 10 is arranged to accelerate the ion beam 106 to form a high energy ion beam 115, greater than the ion energy of the ion beam 106, before entering the linear accelerator 10. Note that in different conventions, a buncher 112 may be considered as part of a linear accelerator, or as a separate element to a linear accelerator. As is known, a buncher such as buncher 112 functions to receive an ion beam as a continuous ion beam and to output the ion beam as a bunched ion beam, meaning a plurality or series of discrete packets of ions separated in space and time. Like acceleration stages, the buncher may apply a high frequency signal to the ion beam, with a result that the ion beam, initially continuous, becomes bunched. Unless otherwise noted, the "acceleration stages" of a linear accelerator that are described herein, process and accelerate ion beams that are already bunched.

As also noted with respect to FIG. 1A, the linear accelerator 10 may include a plurality of acceleration stages (20-A to 20-N), arranged in series, as shown. In various embodiments, the ion energy of the high energy ion beam 115 may represent the final ion energy for the ion beam 106, or approximately the final ion energy. In various embodiments, the ion implanter 100 may include additional components, such as filter magnet 116, a scanner 118, collimator 120, where the general functions of the scanner 118 and collimator 120 are well known and will not be described herein in further detail. As such, a high energy ion beam, represented by the high energy ion beam 115, may be delivered to an end station 122 for processing a substrate 124. Non-limiting energy ranges for the high energy ion beam 115 include 500 keV-10 MeV, where the ion energy of the ion beam 106 is increased in steps through the various acceleration stages of the linear accelerator 10.

Returning to FIG. 1A, where details of two acceleration stages are shown, the acceleration stage 20-A and acceleration stage 20-B are arranged as triple gap electrode assembly. The term "triple gap" as used herein may refer to the presence of three gaps between electrodes within a given acceleration stage. For example, in the acceleration stage 20-A and the acceleration stage 20-B the electrode assembly includes a first grounded drift tube 34, and an AC drift tube assembly, including a first AC drift tube electrode 30 and a second AC drift tube electrode 32, and a second grounded drift tube 36. This assembly of electrodes are all arranged as hollow conductive cylinders to conduct an ion beam 106 therethrough. According to various embodiments of the disclosure, the ion beam 106 may be received at a given acceleration stage as a bunched ion beam, meaning that the ion beam 106 is received as a plurality of packets that are separated from one another. Thus, different ion packets of the ion beam 106 arrive at the acceleration stage 20-A at different times, and are accordingly accelerated and conducted through the acceleration stage 20-A in sequence.

As shown in FIG. 1A, the RF power assembly 40-A is electrically coupled to a resonator 22, to drive an RF voltage signal within the resonator 22. For example, the resonator 22 may be arranged as a high frequency step up transformer to output an RF voltage signal having a high voltage amplitude, such as 10 kV to 100 kV, or other high voltage. Similar resonators may be included in the other acceleration stages of the linear accelerator 10, and in some embodiments may be individually coupled to dedicated RF power assemblies, where an RF power assembly 40-B is shown for acceleration stage 20-B. The resonator 22 has a first output end, coupled to the first AC drift tube electrode 30, and a second output end, coupled to the second AC drift tube electrode 32. When an RF signal is sent to the resonator 22, the resonator 22 may resonate according to the frequency of the RF voltage and the configuration of the resonator 22. More particularly, the resonator 22 will exhibit a fundamental (resonance) frequency, corresponding to a first Eigenmode frequency, and outputs voltage signal to the first AC drift tube electrode 30 that is generally 180 degrees shifted from the voltage signal output to the second AC drift tube electrode 32. In this manner, the ion beam 106 is accelerated across the gaps between the various electrodes of the acceleration stage 20-A.

Referring now to FIG. 1B, there is shown a reference linear accelerator 50, which accelerator may have multiple acceleration stages as in the linear accelerator 50. These acceleration stages are represented by two acceleration stages, acceleration stage 60-A and acceleration stage 60-B. The acceleration stage 60-A is shown in some detail, where the acceleration stage 60-A is arranged as triple gap electrode assembly, discussed above with respect to FIG. 1A. One difference with respect to acceleration stage 20-A is that a first grounded drift tube 54, and a second grounded drift tube 56 may be longer than their grounded drift tube counterparts in acceleration stage 20-A.

The reference linear accelerator 50 illustrates some components of known linear accelerators of ion implanters. As is well known, ion implanters process ion species based upon elements or molecules, such as hydrogen, helium, oxygen, boron, carbon, phosphorous, arsenic, to a name a few species.

To properly accelerate and conduct the ion beam 106, besides the resonator 22, the reference linear accelerator 50 includes a quadrupole element 62 and quadrupole element 64. These quadrupole elements may be an electrostatic quadrupole or a magnetic quadrupole. The quadrupole element 62 and quadrupole element 64 act to focus an ion beam 166, and accordingly may prevent undue loss of current and energy when the ion beam is accelerated through the acceleration stage 60-A. Acceleration stage 60-B and other acceleration stages of the reference linear accelerator 50 will also include similar quadrupole elements. Maintaining good transmission of the beam requires focusing because the mutual repulsion of the positive ions in a bunch will exert a force (the "space charge force") that, if left unchecked, will cause the beam the spread out laterally and longitudinally and eventually the ions will strike the sidewalls or fall out of the right phase relationship for acceleration.

While the general configuration of an acceleration stage shown in FIG. 1B is universally used in ion implanters based upon linear accelerators, the present inventor has discovered that proper acceleration and focusing of an ion beam may be accomplished using a drift tube assembly as generally shown in the acceleration stage 20-A of FIG. 1A, where no quadrupole element is present. There is general acceptance of the idea that a RF accelerating structure such as an AC-drift tube in a linear accelerator will produce radial defocusing as a consequence of phase focusing, and thus a focusing structure such as the quadrupole elements is required in a given acceleration stage. However, modeling by the present inventor shows that proper focusing may still be achieved in an RF-linear accelerator without a quadrupole present.

Figure 2A:
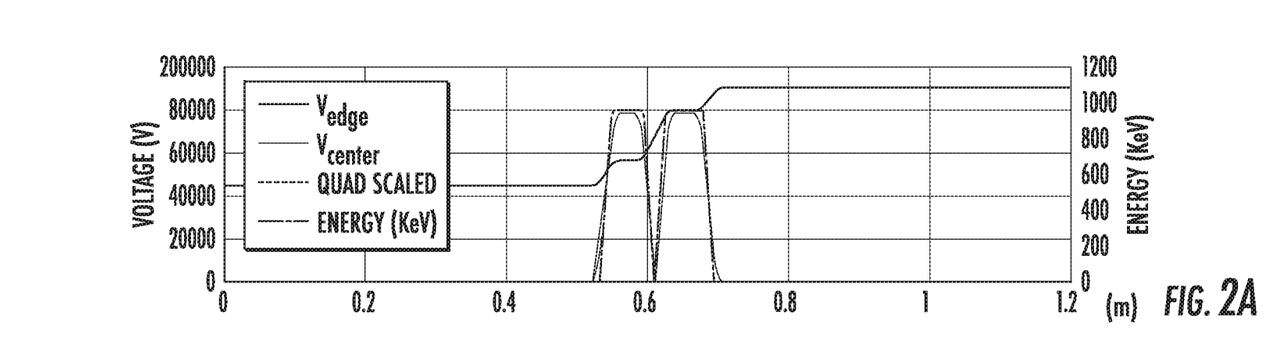
FIGS. 2A-2C illustrates simulations of electrical behavior during operation of an exemplary linear accelerator in accordance with embodiments of the disclosure.
Figure 2B:
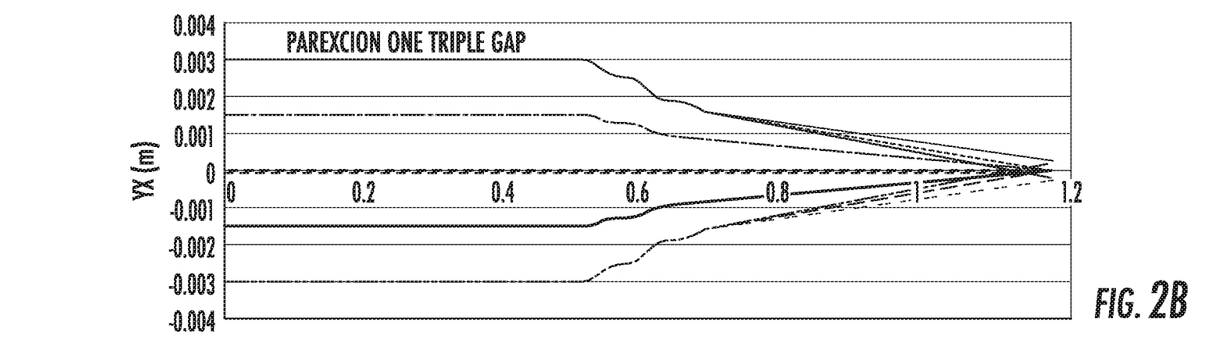
Figure 2C:
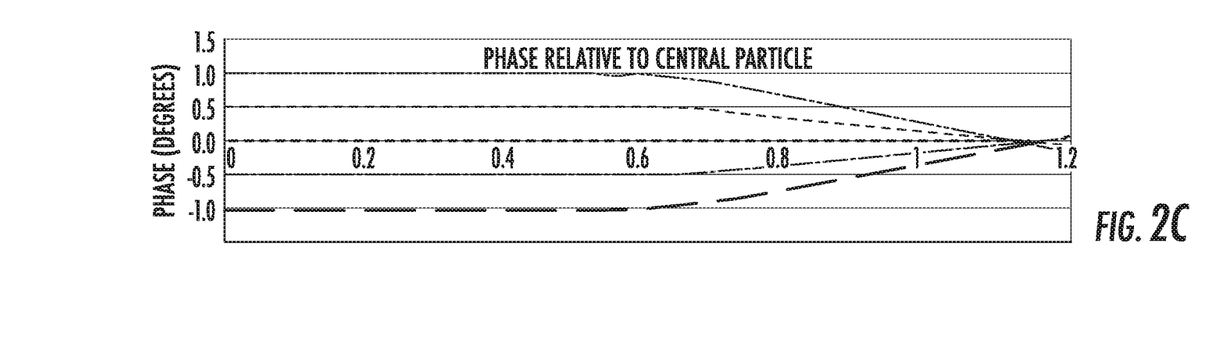

FIGS. 2A-2C illustrates simulations of electrical behavior during operation of an exemplary linear accelerator in accordance with embodiments of the disclosure. In particular, these figures represent the output of an ion trajectory tracing program using doubly charged phosphorous ions for the various calculations performed. The ions are modeled as entering on the left side of the figures with an initial energy of 540 keV, and are accelerated by a triple gap accelerator (the position of an accelerating electrodes is shown in the middle of the X-axis) with maximum voltage amplitude of 80 kV, and reach an energy of 900 keV as the ions are accelerated. FIG. 2A shows the magnitude of the potential on the electrodes (left axis) and the energy of the ions (right axis). FIG. 2B shows the X & Y positions of the ions with respect to the axis, while the FIG. 2C shows the phase of the RF voltage at the position of the ions in the simulation. This result shows that the doubly charge phosphorous ions are on average focused towards the middle of the beamline, while the FIG. 2C shows in particular that the phases of ions more convergent on exit than on entrance. Note that for simplicity these simulations do not include space charge forces and, in actual practice, an ion beam will not converge to a point in x, y, or φ. However, by careful adjustment of the phase of the voltages the focusing forces may be balanced against the space charge forces and a small parallel beam input and output may be achieved for each accelerating stage, and thus good beam transmission along the beamline.

Figure 1D:
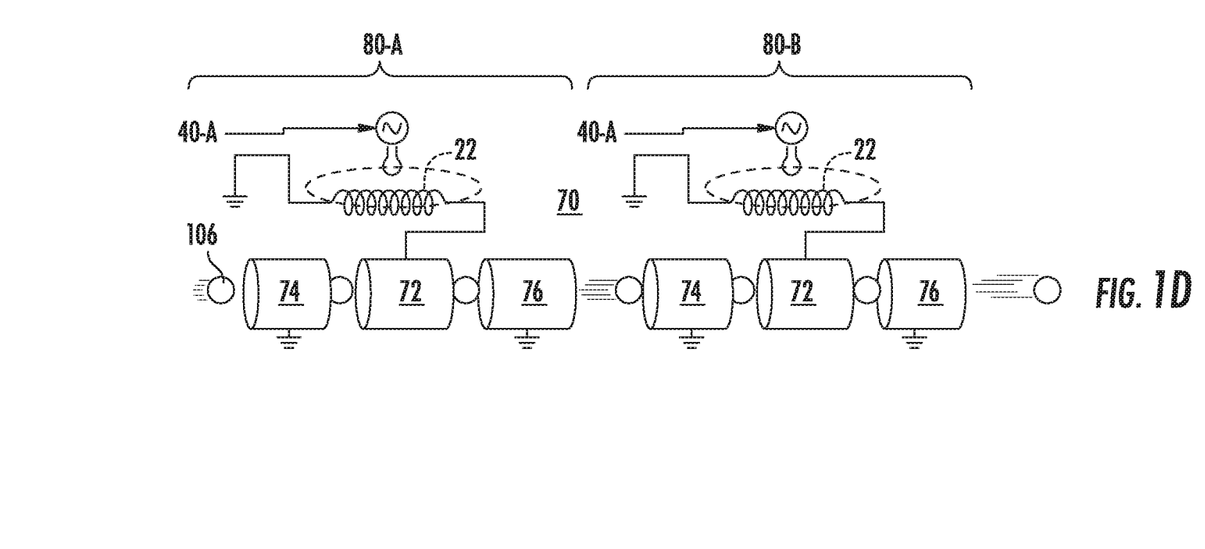
FIG. 1D shows an exemplary apparatus, according to embodiments of the disclosure.

While the aforementioned embodiments focus on acceleration stages having a triple gap configuration, in further embodiments, a double gap acceleration stage is provided without a quadrupole element. Referring to FIG. 1D, there is shown a linear accelerator 70, where details of two acceleration stages are shown, the acceleration stage 80-A and acceleration stage 80-B are arranged as a double gap electrode assembly. The term "double gap" as used herein may refer to the presence of two gaps between electrodes within a given acceleration stage. For example, in the acceleration stage 80-A and the acceleration stage 80-B the electrode assembly includes a first grounded drift tube 74, just one AC drift tube electrode 72, and a second grounded drift tube 76. Like an acceleration stage having a triple gap configuration, one or more acceleration stages of the linear accelerator 70 may be arranged without a quadrupole element, and may yet accelerate and focus an ion beam.

In view of the above results, a linear accelerator for ion implantation that does not use a quadrupole between each acceleration stage in the accelerator may be effective accelerate and focus and ion beam. While the above results are illustrated for phosphorous, these results will be readily extendible to a wide range of mass/charge ratios, including for commonly used ions in an ion implanter.

Without limitation to a particular theory, the ability to achieve proper focus of ions conducted through an RF LINAC accelerating electrode assembly without the use of quadrupole elements may stem from the fact that particles used in ion implanters are relatively heavy and are accelerated to just a few MeV. Because of this relatively high mass and relatively low energy ions commonly used in an ion implanter do not achieve velocities more than a fraction of the speed of light, such as less than 0.1 c. The universal adoption of quadrupoles in ion implanter LINACs was predicated upon the earlier-developed linear accelerator technology, as employed in accelerators used for high energy physics research. These systems almost always address particles (protons, electrons) travelling at very close to the speed of light. At these high energies, all particles are essentially travelling at the speed of light ($\beta=v/c \geq 0.9$), and thus they spend an equal amount of time in any given length of the beamline. This circumstance results in no net focusing or defocusing in an acceleration gap, so that quadrupoles are needed to counteract the ever present space charge forces. The situation with the relatively slow ion beams used in semiconductor manufacturing is different, as can be understood by reference to FIG. 3, which figure shows the details of a single accelerating gap in an acceleration stage 300. As shown therein, a power supply 302 generates a voltage difference between a pair of cylindrical electrodes (304, 306), shown in cross section. The shape of the equipotential curves 308 of the accelerating field is indicated, showing how the equipotential curves 308 bulge in towards the inside of the tubular electrodes (first electrode 404 and second electrode 306). This bulge is a direct consequence of Laplace's equation $\nabla^2 V=0$ that gives the shape of the equipotentials established by a set of conductors in vacuum. As can be seen the bulge in the first half of the gap exerts a force towards the axis (a focusing force) for a particle of the ion beam 310 travelling off axis, while the symmetrical bulge in the second half of the gap exerts a force away from the axis (a defocusing force). Under the assumption of a constant velocity ($\beta \geq 0.9$), the amount of time spent in each half is the same and there is no net focusing or defocusing. Under the conditions in semiconductor tools, however, with $\beta \leq 0.5$, there is a significant increase in velocity and the ion spends less time in the defocusing field in the second half of the gap and therefore experiences net focusing. Thus, for these cases, it is possible to make a beamline with no quadrupoles associated with each stage of the accelerating structure, and to counteract the space charge forces with the focusing derived from the accelerating structure components, meaning the accelerating electrodes of a given accelerator stage.

As a consequence of the removal of the quadrupole elements from a linear accelerator stage, the drift tube assembly may be reconfigured. In particular, in known ion implanter linear accelerators, the quadrupole elements are positioned at the position of grounded drift tubes, such as surrounding the grounded drift tubes. The grounded drift tubes tend to be elongated at this position to support the quadrupole elements. With the removal of the quadrupole elements, the grounded drift tubes may be sized according to other considerations, and in particular, the length of the grounded drift tubes may be reduce to a more compact configuration, where a value of the drift tube length (L) is based upon the drift tube diameter (D), wherein L/D is less than 2, and in some cases may be 1.5. The resulting relatively shortened length of a drift tube assembly is shown by a comparison of FIG. 1A to FIG. 1B.

As such, this more compact configuration may be accompanied by a rotated resonator design, wherein a first resonator coupled to a first acceleration stage is rotated with respect to a second resonator, coupled to a second acceleration stage, adjacent to the first acceleration stage. This rotated resonator design may be used so that more compact packing of resonators along the beamline is achieved so as not to limit the ability to reduce acceleration stage length.

In some embodiments of an ion implanter, every acceleration stage of a linear accelerator may be constructed without any quadrupole element. In other embodiments of an ion implanter one or more acceleration stages (such as two acceleration stages, three acceleration stages, five acceleration stages, ten acceleration stages, etc.) may include a quadrupole element, while one or more acceleration stage does not include a quadrupole element. Since the focusing effect of an accelerating stage scales with the relative change in velocity, this focusing effect is strongest in the early (upstream) stages of a LINAC, where the relative change in velocity is largest. On the other hand, the space charge forces driving the requirement for constant focusing are strongest at relatively lower velocity, so the potential benefit of different focusing structures, and selective placement of quadrupoles in one or more stages may proceed on a case-by-case basis, according to different embodiments of the disclosure.

Figure 3:
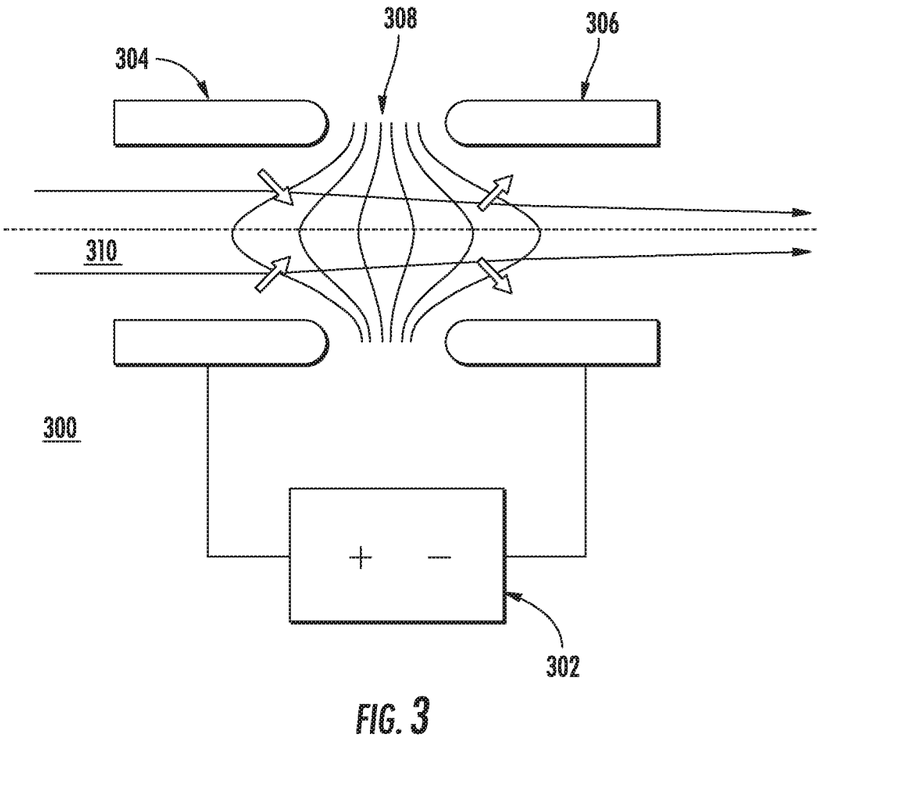
FIG. 3 depicts focusing mechanisms in an exemplary acceleration stage of a linear accelerator.
Figure 4:
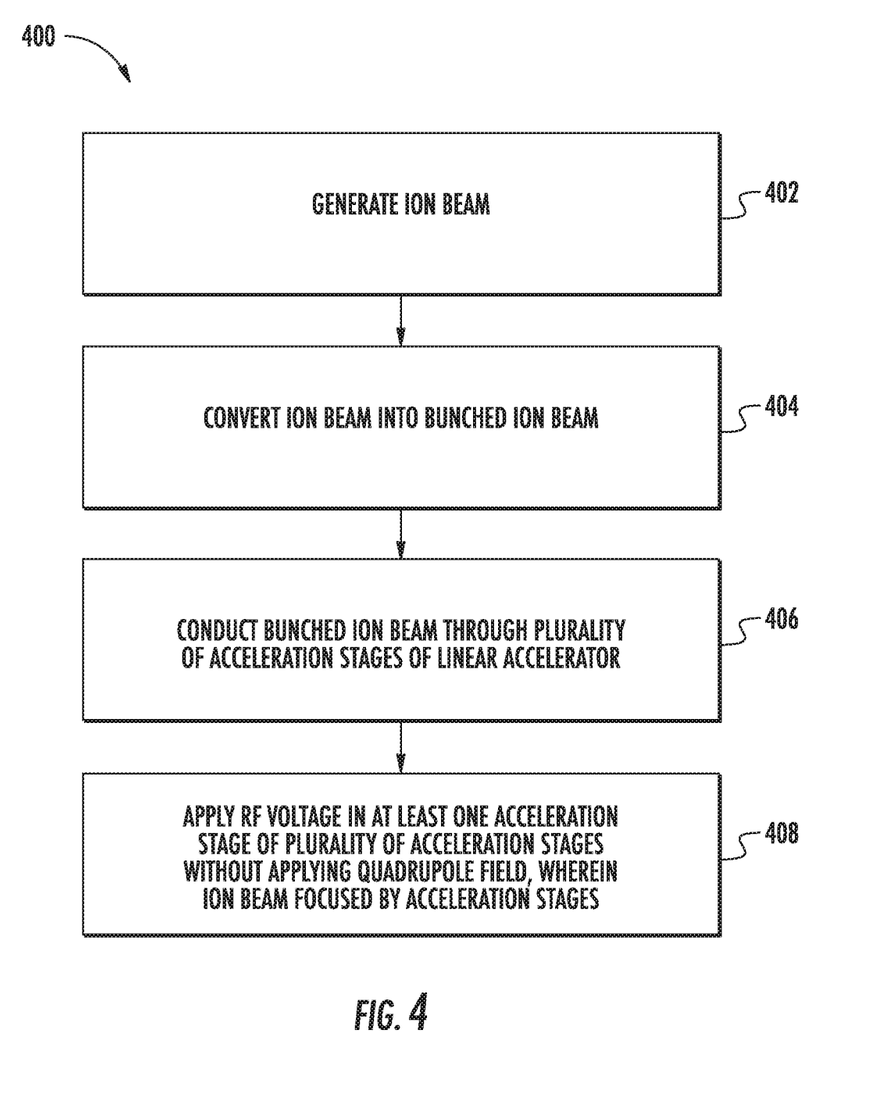
FIG. 4 presents an exemplary process flow.

FIG. 3 depicts an exemplary process flow 300. At block 302, an ion beam is generated. The ion beam may include any suitable ions, and may be generated in a beamline ion implanter. At block 304, the ion beam is converted from a continuous ion beam into a bunched ion beam, where the ion beam is propagated in a series of discrete ion packets. At block 306, the bunched ion beam is conducted through a plurality of acceleration stages of a linear accelerator. At block 308 an rf voltage is applied in at least one acceleration stage of the plurality of acceleration stages without applying quadrupole field, wherein the ion beam is focused by acceleration stages.

In view of the foregoing, at least the following advantages are achieved by the embodiments disclosed herein. By providing an approach to accelerate bunched ion beams using an RF accelerating voltage without quadrupole elements, the present embodiments provide the advantage of avoiding complexity and cost associated with the quadrupole elements. A further advantage provided by the present embodiments is that the length of acceleration stages and the linear accelerator as a whole may be reduced by removing quadrupole elements that may constrain drift tubes to be longer than necessary.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implantation system, comprising:
an ion source and extraction system, arranged to generate an ion beam at a first energy; and
a linear accelerator, disposed downstream of the ion source, the linear accelerator arranged to receive the ion beam as a bunched ion beam and accelerate the ion beam to a second energy, greater than the first energy, wherein the linear accelerator comprises a plurality of acceleration stages, wherein a given acceleration stage of the plurality of acceleration stages comprises:
a drift tube assembly, arranged to conduct the ion beam;
a resonator, electrically coupled to the drift tube assembly; and
an RF power assembly, coupled to the resonator, and arranged to output an RF signal to the resonator,
wherein the drift tube assembly comprises a first grounded drift tube, an AC drift tube assembly, disposed downstream of the first grounded drift tube, and a second grounded drift tube, disposed downstream of the AC drift tube assembly, and wherein at least one of the first grounded drift tube and the second grounded drift tube comprises a compact configuration, wherein the compact configuration comprises a drift tube length (L) and a drift tube diameter (D), wherein L/D is less than 2.

2. The ion implantation system of claim 1, the linear accelerator comprising at least three acceleration stages.

3. The ion implantation system of claim 1, wherein the AC drift tube assembly comprises a first AC drift tube and a second AC drift tube, downstream to the first AC drift tube, wherein the resonator is coupled to the first AC drift tube on a first end, and wherein the resonator is coupled to the second AC drift tube on a second end.

4. The ion implantation system of claim 1, wherein the RF signal comprises a frequency between 13.56 MHz and 27.12 MHz.

5. The ion implantation system of claim 1, wherein the linear accelerator comprises a rotated resonator design, wherein a first resonator coupled to a first acceleration stage is rotated with respect to a second resonator, coupled to a second acceleration stage, adjacent to the first acceleration stage.

6. A method of operating an ion implanter, comprising:
generating an ion beam;
bunching the ion beam, wherein the ion beam is transformed into a plurality of bunched ion packets;
accelerating the bunched ion packets through a plurality of acceleration stages of a linear accelerator, wherein the accelerating comprises:
in at least one stage of the plurality of acceleration stages, applying an RF signal to a drift tube assembly to accelerate the ion beam from an initial ion energy to a higher ion energy, without applying a quadrupole field to the ion beam, wherein the ion beam is focused by the drift tube assembly; and
implanting the ion beam after passing through the linear accelerator into a substrate,
wherein the plurality of acceleration stages individually comprise a drift tube assembly that includes a first grounded drift tube, an AC drift tube assembly, disposed downstream of the first grounded drift tube, a second AC drift tube, disposed downstream of the AC drift tube assembly, and a second grounded drift tube, disposed downstream of the second AC drift tube, and
wherein at least one of the first grounded drift tube and the second grounded drift tube comprises a compact configuration, wherein the compact configuration comprises a drift tube length (L) and a drift tube diameter (D), wherein L/D is less than 2.

7. The method of claim 6, wherein the a plurality of RF signals are applied to the plurality of acceleration stages, respectively, without applying a quadrupole field to the ion beam.

8. The method of claim 6, wherein the RF signal comprises a frequency between 13.56 MHz and 27.12 MHz.

9. A linear accelerator, disposed within an ion implantation system, comprising:
a plurality of acceleration stages, wherein at least one acceleration stage of the plurality of acceleration stages comprises:
a drift tube assembly, arranged to receive and transport an ion beam as a bunched ion beam, the drift tube assembly comprising a triple gap configuration or a double gap configuration; and
a resonator, electrically coupled to the drift tube assembly,
wherein the drift tube assembly comprises a first grounded drift tube, an AC drift tube assembly, disposed downstream of the first grounded drift tube, and a second grounded drift tube, disposed downstream of the AC drift tube assembly,
and wherein at least one of the first grounded drift tube and the second grounded drift tube comprises a compact configuration, wherein the compact configuration comprises a drift tube length (L) and a drift tube diameter (D), wherein L/D is less than 2.

10. The linear accelerator of claim 9, the linear accelerator comprising at least three acceleration stages.

11. The linear accelerator of claim 9, wherein one or more acceleration stages of the plurality of acceleration stages includes a quadrupole element.

* * * * *